(12) United States Patent
Aoki

(10) Patent No.: US 7,024,604 B2
(45) Date of Patent: Apr. 4, 2006

(54) PROCESS FOR MANUFACTURING SEMICONDUCTOR DEVICE

(75) Inventor: Hideyuki Aoki, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 513 days.

(21) Appl. No.: 10/274,144

(22) Filed: Oct. 21, 2002

(65) Prior Publication Data

US 2003/0121584 A1    Jul. 3, 2003

(30) Foreign Application Priority Data

Dec. 28, 2001    (JP) .............................. 2001-398832

(51) Int. Cl.
G11C 29/00 (2006.01)
(52) U.S. Cl. ....................... 714/720; 714/718; 714/723
(58) Field of Classification Search ................ 714/718, 714/720, 723; G11C 29/00
See application file for complete search history.

(56) References Cited

U.S. PATENT DOCUMENTS 5,241,266 A * 8/1993 Ahmad et al. ............... 714/733
6,591,385 B1 * 7/2003 Krech et al. ................. 714/718
2002/0046374 A1 * 4/2002 Aoki et al. .................. 714/719
2003/0038365 A1 * 2/2003 Farnworth et al. ............. 714/7

FOREIGN PATENT DOCUMENTS

JP             06342600 A   * 12/1994

* cited by examiner

Primary Examiner—R. Stephen Dildine
(74) Attorney, Agent, or Firm—Reed Smith LLP; Stanley P. Fisher, Esq.; Juan Carlos A. Marquez, Esq.

(57) ABSTRACT

A semiconductor device manufacturing process which includes a test process that minimizes the test time for a single wafer, reduces the test cost and improves the throughput. The test system is made up of a wafer which includes plural chips formed with flash memories, a wafer level whole-surface contact device for contact with the whole surface of the wafer, a tester for testing electric characteristics of the wafer, and a BOST board interposed between the tester and the wafer level whole-surface contact device and with chip-by-chip control circuits mounted thereon. Where the test time differs depending on each chip in the wafer, the BOST board controls each test item for each chip so that in a parallel manner for the chips, upon completion of a preceding test, a shift is made to the next test.

7 Claims, 11 Drawing Sheets

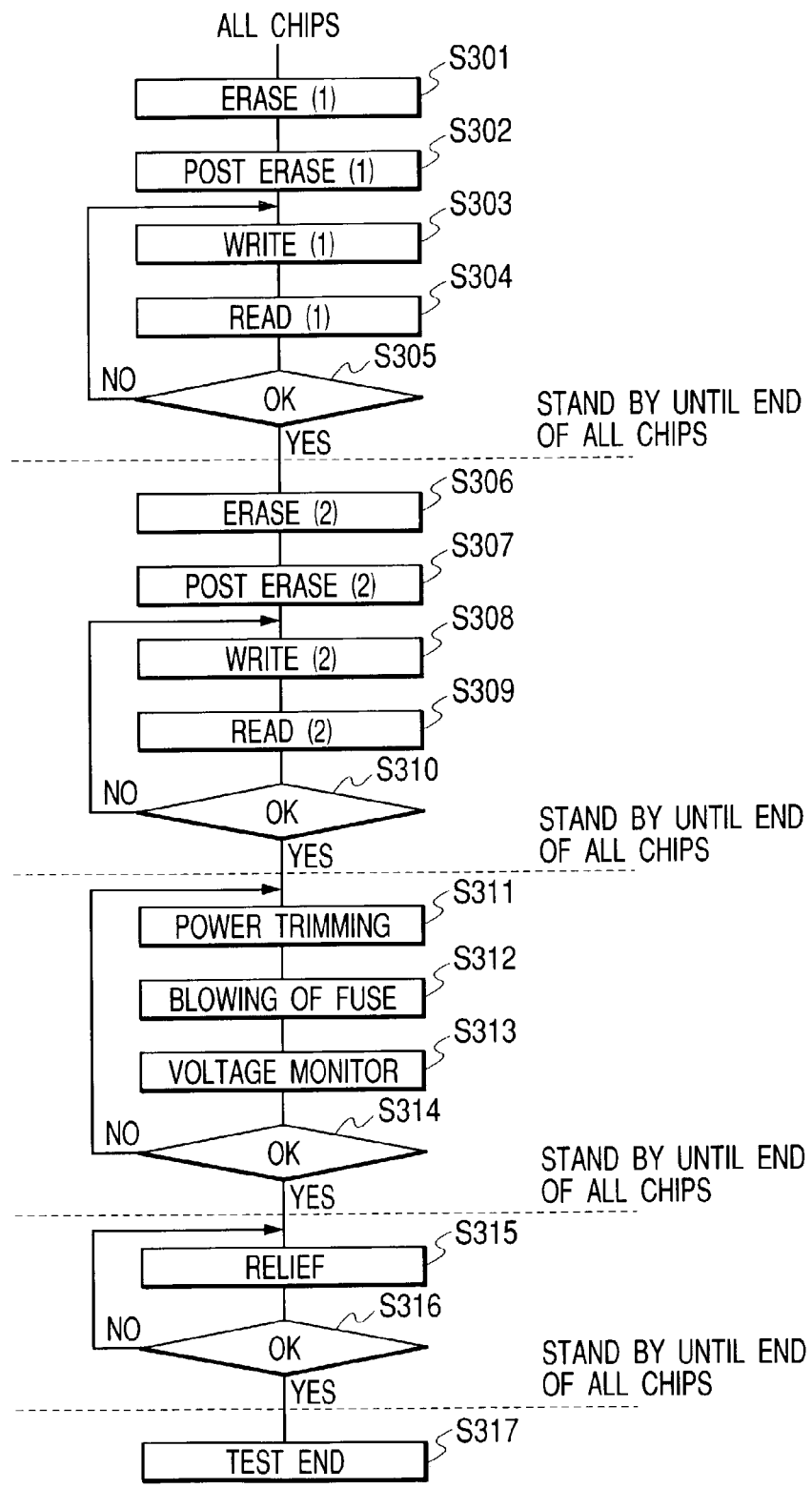

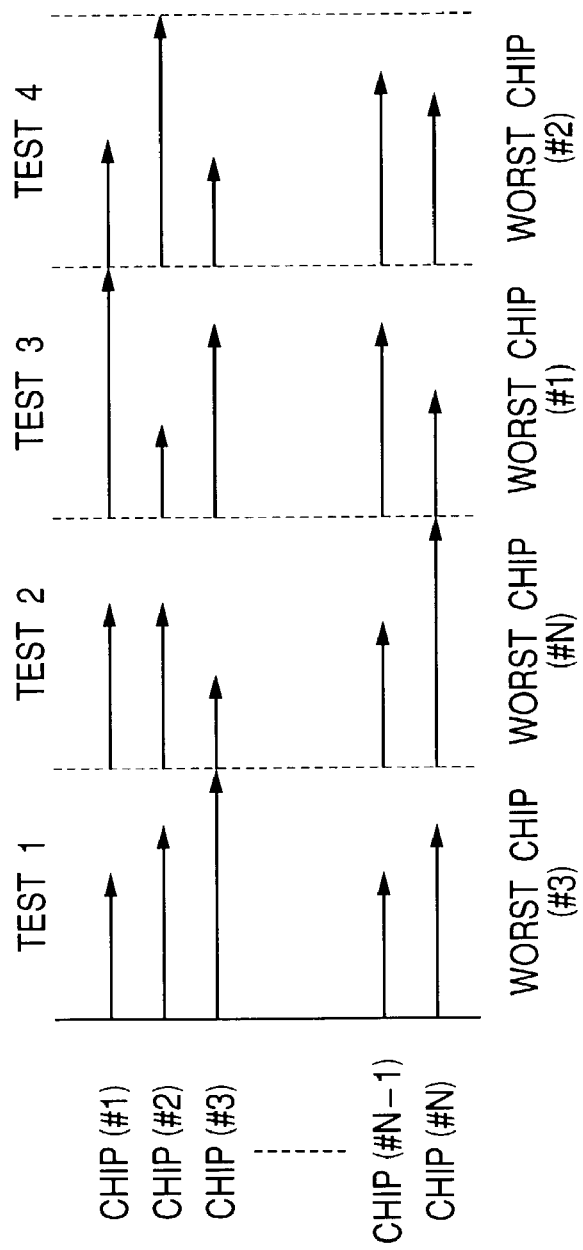

PROCESS FOR MANUFACTURING SEMICONDUCTOR DEVICE

BACKGROUND OF THE INVENTION

The present invention relates to a semiconductor device manufacturing technique and more particularly to a technique which is effectively applicable to a simultaneous test method for the state of a semiconductor wafer, so-called wafer level, by whole-surface contact in a semiconductor device testing step such as a flash memory testing step.

SUMMARY OF THE INVENTION

According to studies made by the present inventor, the following techniques are considered as semiconductor device testing techniques.

For example, for a flash memory as an example of a semiconductor device there is adopted a simple method wherein write or erase of "0" level and write of "1" level are performed for a memory cell and then the data are read to check whether the erase and write have been conducted normally or not. According to this test method a relatively simple Good-Bad detection such as cell stack imperfection can be effected. As complicated tests, such test methods as marching, checker, and galloping are considered as necessary. These test methods are effective in detecting such defects as interference between memory cells and multiple decoder selection which defects are brought about unwillingly, for example, by a combination of access data between a memory cell concerned and a memory cell adjacent thereof or by a combination of an address concerned and an address adjacent thereto.

The above write-erase test is completed in a short time if all of memory cells to be tested possess desired characteristics which permit a relatively short time completion of write and erase. As known well, however, for such a semiconductor device as a flash memory, it is inevitable to allow relatively large variations in its write and erase characteristics. Allowance of large variations in write and erase characteristics typically means a great change in write operation time and erase operation time. For example, as to write operation, such a write operation as a unit write operation and a subsequent decision operation which means memory cell write level decision by read or read verifying, are not always completed as a single operation, but are repeated plural times until it is judged that the memory cell write level has reached an appropriate level. Likewise, as to erase operation, such an erase operation as a unit erase operation and a subsequent erase level verifying operation are repeated plural times as necessary. Therefore, a relatively long time is sometimes required for test decision. Additionally, in such a semiconductor device as a flash memory, the time itself required for its unit write or erase operation is much longer than that of such known memories as SRAM (Static Random Access Memory) and DRAM (Dynamic Random Access Memory).

SRAM and DRAM can each be tested in a relatively short and nearly constant time with a predetermined operation cycle, whereas in the case of a flash memory, under the aforesaid circumstances, the test time is relatively long and there occurs a great variation in the test time, thus making it difficult to expect a high test throughput.

In connection with the semiconductor device testing technique, reference can be made to a simultaneous multi-chip testing method which can be regarded rather as a commonly-adopted method in shortening the test time despite a large number of chips. However, in the case of such a semiconductor device (chip) as the foregoing flash memory which should be allowed to have a relatively wide characteristic range or operation period, and if a chip is present which repeats relatively many times of write and erase operations, the overall test time is prolonged due to the presence of such a chip, while if there is a chip which is likely to be defective, the time required for finally deciding that the chip is defective causes prolongation of the test time. Thus, in this type of a semiconductor device, the test time is not always shortened to a satisfactory extent.

In what is called wafer test, the application of the simultaneous multi-chip testing technique (hereinafter referred to as the "simultaneous wafer level testing technique") to a construction wherein plural semiconductor chips are formed on a semiconductor wafer (the chips are obtained by dicing the wafer, but for convenience' sake this construction will hereinafter be referred to as "semiconductor chip" to avoid complication of expression), makes it possible to expect shortening of the total test time. However, the foregoing problems with test time encountered in such a semiconductor device as flash memory still remain to be solved also in the simultaneous wafer level testing technique.

Therefore, in connection with the problems on the test of flash memory, an example of a technique which the present inventor has studied as a premise of the present invention will be described below in more detail with reference to FIGS. 10 and 11.

FIG. 10 shows a testing flow in a simultaneous test method by simultaneous contact with plural semiconductor chips in a wafer level, i.e., in a state of wafer before being divided into individual semiconductor chips (not shown), and FIG. 11 shows an example of a test time sequence in the testing flow of FIG. 10.

The test for a flash memory, which is conducted for each of plural semiconductor chips, for example in FIG. 10, comprises erasing a desired memory range under a first test condition (step S301), post-erasing, i.e., rewriting a weak level for converging the threshold voltage of the erased memory cell to a predetermined range (S302), write with a first write pattern for plural memory cells (S303), read (S304), and decision (S305). For example, there are set a first test in which steps S303 to S305 are again executed repeatedly if the write level is judged to be insufficient, a second test (S306 to S310) which goes through the same steps as in the first test under a second test condition different from the first test condition, a third test (S311 to 314) which comprises power trimming, blowing of fuse, voltage monitor, and decision, and a fourth test (S315 and S316) which comprises relief and decision.

In the flow of FIG. 10, first, the first test is conducted and a check is made to see if the first test has been completed for all of chips. A complete end of the first test stands by until the first test comes to an end for all the chips to be subjected to the parallel simultaneous test. When the first test of all the chips is over, a shift is made to the execution of the second test. Subsequently, in the same manner as above, the second test is conducted, and when the second test for all the chips is over, a shift is made to the execution of the third test, then after the end of the third test, the execution of the fourth test is started. When the fourth test of all the chips is over, the test of all test items is completed, that is, the test comes to an end (S317).

In FIG. 11 there is shown an example of test time sequence for tests 1, 2, 3, and 4 which correspond to the first to fourth tests, respectively, in FIG. 10 with respect to chips (#1), (#2), (#3), . . . , (#N−1), (#N) on wafer (not shown).

The sequence of FIG. 11 shows that the test is started in the order of tests 1, 2, 3, and 4 for all the chips (#1) to (#N) on the wafer (not shown).

In each test, the test end time of each chip may differ to a relatively great extent depending on the foregoing characteristics of the flash memory. In the sequence illustrated in FIG. 11, the test end time of chip (#3) is the latest in test 1, indicating that the chip is the worst chip. Likewise, the sequence of FIG. 11 indicates that the chips (#N), (#1), and (#2) are the worst chips in tests 2, 3, and 4, respectively.

As is apparent from the sequence example shown in FIG. 11, in the simultaneous test method by simultaneous plural chip contact at the wafer level, even if the test of all the chips on wafer to be tested simultaneously is started at a time, the test end time differs. Accordingly, the end of the test started simultaneously for plural chips depends on the worst chip included in the chips on wafer to be tested simultaneously. In this case, the tester used itself is difficult to adopt such a complicated construction as causes each of plural semiconductor chips to perform a testing operation each individually. Under such circumstances, a chip which has gone through the test earlier than the other chips is left in a stand-by state without being shifted to the next testing operation until the test of the other chips started simultaneously comes to an end. In plural test steps it is not always the same chip that becomes the worst chip. In the above test sequence, therefore, if different chips become worst test end time chips in various test items, the total test time corresponds to the sum total of worst chip test times, with consequent likelihood of prolongation of the test time. Thus, in a flash memory or the like which undergoes a significant different in test time among chips due to variations in process of memory cells, it is desired to shorten the test time.

In this connection, the present inventor has thought out controlling the execution of each test independently for each chip while adopting a simultaneous testing method involving whole-surface contact for plural semiconductor chips at the wafer level. More specifically, I have hit upon a method in which a testing operation is started at a time for plural chips, but a substrate for controlling each chip is inserted between the chip and the tester used, permitting a chip which has gone through test earlier than the other chips to advance to the next test without waiting for the end of test of the other chips. I have noted the point that by adopting this method it becomes possible to complete each test without being restricted by worst chips which differ test by test.

Accordingly, it is an object of the present invention to provide a process for manufacturing a semiconductor device including test steps which method can shorten the test time for one wafer and can thereby reduce the cost of the test and improve the throughput.

The above and other objects and novel features of the present invention will become apparent from the following description and the accompanying drawings.

Typical inventions disclosed herein will be outlined below.

A process for manufacturing a semiconductor device according to the present invention has a step of contacting plural chips on wafer and testing electric characteristics of the chips in a parallel manner. This step of testing electric characteristics possesses the following features.

(1) A common test control signal is provided from a tester to a BOST (Built Out Self Test) circuit interposed between the tester and a wafer, and a test signal is fed from the BOST circuit to each chip on the wafer, whereby test is conducted chip by chip, further, another test is conducted simultaneously for plural chips on the wafer.

(2) A common test control signal is fed to the BOST circuit interposed between the tester and the wafer and a test signal is fed from the BOST circuit to a first set of chips on the wafer to conduct test chip by chip, while another test is conducted simultaneously for plural chips out of the first set of chips on the wafer. Further, after the execution of test items for the first set of chips has been completed, a test signal is fed from the BOST circuit to chips other than the first set of chips. Thus, successively, after the end of execution of test items for chips to be tested, a test signal is fed to chips not tested yet and test items are executed chip by chip.

The tester receives test results of plural chips from the BOST circuit and performs a necessary control operation such as the formation of data on the basis of the received test results. Therefore, as to the relation between the tester and the BOST circuit, it can be regarded that the tester is a high order tester and the BOST circuit is a low order tester or that the tester is a test controller and the BOST circuit is a tester controlled by the BOST circuit.

In the above semiconductor device manufacturing process according to the present invention, even if the test time of each chip on the wafer differs, the total test time for one wafer can be minimized because each test item is controlled chip by chip by means of the BOST circuit. As a result, it is possible to reduce the cost of test and improve the throughput.

Another semiconductor device manufacturing process according to the present invention involves testing electric characteristics of plural chips by contact with plural chips on wafer in a relatively thick state of the wafer, a subsequent wafer back grinding such as that using the so-called back grinding technique, and division of the wafer into individual chips with use of a dicing technique for example, to afford chips as products superior in test results of their electric characteristics.

A relatively thick semiconductor wafer is difficult to be deflected or cracked because of its such thickness and relatively high rigidity, permitting an appropriate conveyance thereof or setting thereof to a suitable stage in a semiconductor integrated circuit device. Further, such a wafer makes it possible to diminish its deformation against such a relatively high pressure or load from a contactor as is required in attaining a satisfactory contact with plural chips at the aforesaid wafer level. On the other hand, a thin semiconductor chip is considered appropriate in reducing the thickness and size of an electronic device in which it is used, in increasing the resistance to a thermal stress or a flexural deformation which is artificially applied undesirably, and further in decreasing the thermal resistance of the device. Thus, the use of such a relatively thick wafer as referred to above and the subsequent reduction of thickness by grinding brings about an appropriate manufacturing process.

BRIEF DESCRIPTION OF THE DRAWINGS

FIG. 10 is a test flow diagram showing a simultaneous test method by whole-surface contact at a wafer level used in a semiconductor device manufacturing process having been studied as a process which the present invention premises; and FIG. 11 is an explanatory diagram showing a test time sequence of the test flow of FIG. 10 in the semiconductor device manufacturing process having been studied as a process which the present invention premises.

DETAILED DESCRIPTION OF PREFERRED EMBODIMENTS

Figure 1:
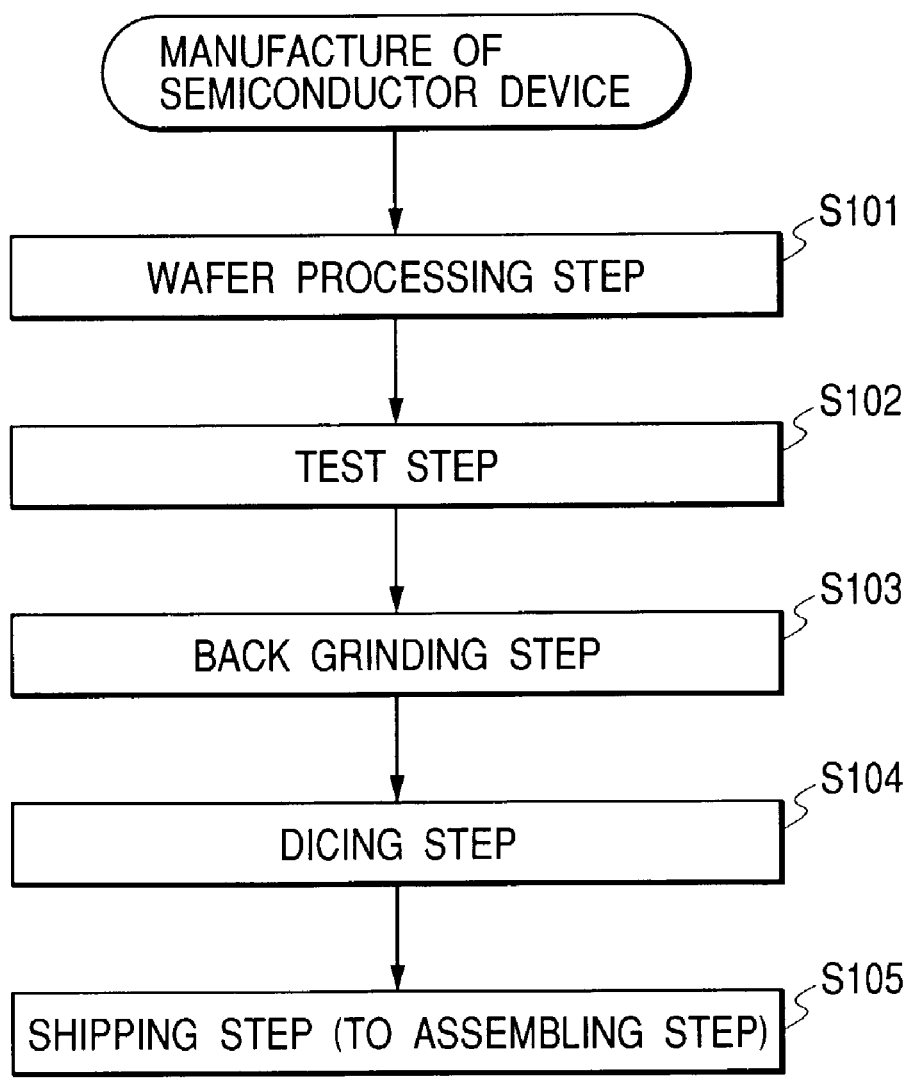
FIG. 1 is a manufacturing flow chart showing a semiconductor device manufacturing process according to a first embodiment of the present invention.

Embodiments of the present invention will be described in detail hereinunder with reference to the accompanying drawings. In all of the drawings for explaining the embodiments, portions having the same functions are identified by like reference numerals and repeated explanations thereof will be omitted.

(First Embodiment)

A semiconductor device manufacturing process according to a first embodiment of the present invention will be described below in detail with reference to FIGS. 1 to 8 which are for illustration of the process.

Reference is first made to FIG. 1 for explaining an example of a manufacturing flow used in the semiconductor device manufacturing process of the first embodiment. FIG. 1 is a manufacturing flow chart showing the semiconductor device manufacturing process of this embodiment.

(1) Wafer Processing Step (S101)

This wafer processing step itself has no direct bearing on the present invention, so the details thereof will not be described here. In this step, wafer processings such as oxidation, application of a gate electrode material for example, selective etching, selective introduction of a conduction impurity, formation of an insulating layer, and formation of a wiring layer, are repeated for a semiconductor wafer provided such as a single crystal silicon, to form a desired integrated circuit.

(2) Test Step (S102)

In this test step, although the details thereof will be described later, an electric contactor is brought into contact with plural chips, preferably all chips, on a wafer to test electric characteristics of the chips in parallel. In this test step are included burn-in in which semiconductor chips having a likelihood of becoming defective in future are subjected to screening, a function test in which a memory function is tested by write and read operations using a predetermined test pattern to check whether operations are performed like predetermined functions, DC tests such as open/short test between input and output terminals, leakage current test, and supply current test, and AC tests for testing AC timing in memory control.

The thickness of the semiconductor wafer used is set at a relatively large value of about 300 to 400 μm. The reason why the semiconductor wafer is thus made relatively thick is as mentioned above.

(3) Back Grinding Step (S103)

In this back grinding step, the back side, i.e., the side opposite to a main surface on which circuit components are formed, of the wafer is subjected to grinding so as to give a desired thinness of the wafer. In the preceding steps up to the test step the wafer has been made relatively thick, so in this back grinding step is performed for grinding the wafer up to a thickness desired as product. For example, the wafer is made as thin as 100 to 150 μm by back grinding.

(4) Dicing Step (S104)

In this dicing step, the wafer is diced chip by chip. As a result, the chips on the wafer are separated into individual chips.

(5) Shipping Step (S105)

In this shipping step, chips found to be good in test results of electric characteristics are shipped as products. Alternatively, such chips of good quality may be conveyed to an assembling step for assembly into a package structure and thereafter the thus-assembled packages may be shipped as products.

In assembling the chips into package structures, there are adopted a die bonding step in which each chip is mounted on a package substrate, a wire bonding step in which pad electrodes on the chip and pad electrodes on the package substrate are electrically connected with each other through wires, a resin molding step in which the chip and the wires are subjected to molding with resin so as to be protected, and a lead molding step in which external leads are subjected to molding and surface treatment. It goes without saying that the chips are also applicable to such a package structure as adopts flip chip bonding in which pads on each chip and pads on a substrate are connected together using bumps.

Figure 2:
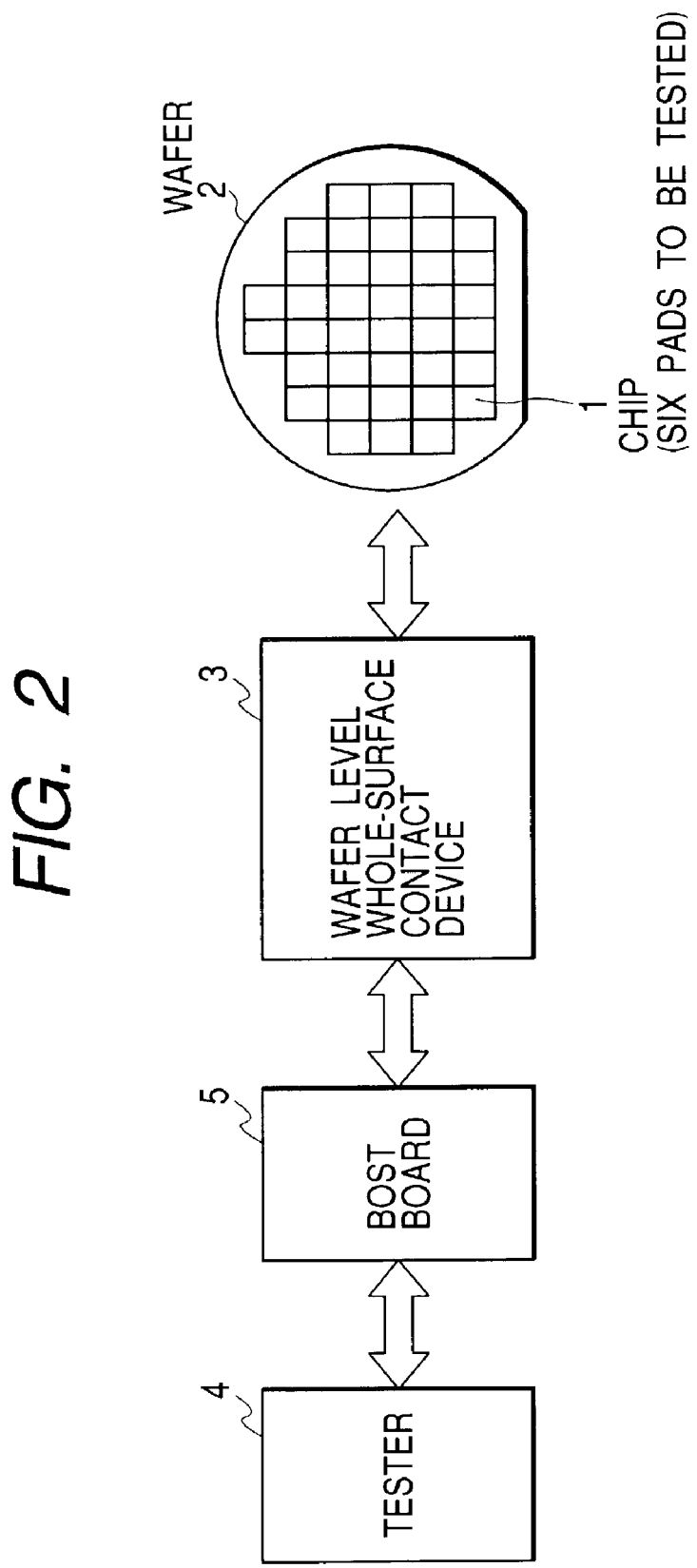
FIG. 2 is a conceptual diagram showing a basic construction of a test system used in the semiconductor device manufacturing process of the first embodiment.

Next, with reference to FIG. 2, a description will be given below about an example of a basic construction of a test system used in the semiconductor device manufacturing process of this embodiment. FIG. 2 is a conceptual diagram showing the basic construction.

The test system is made up of a wafer 2, the wafer 2 having plural chip constituting portions 1 which are to become plural chips each constituting a flash memory for example (the chip constituting portions will hereinafter be referred to merely as "chips" to avoid complication of expression as noted earlier), a wafer level whole-surface contact device 3 for electric contact with the whole surface of the wafer 2, i.e., for contact with all of electrodes required for testing the plural chips, a tester 4 for testing electric characteristics of the chips on the wafer 2, and a BOST board 5 interposed between the tester 4 and the wafer level whole-surface contact device 3 and with a BOST (Built Out Self Test) circuit mounted thereon, the BOST circuit being constituted by a substrate with a chip-by-chip control circuit mounted thereon.

The BOST board 5 has functions which permit a decrease of tester load based on a decrease in the number of signals, E/W speed-up of a flash memory by execution of a forced acceleration test, self-test, self-repair, self-trimming, and MGM processing, although the details thereof will be described later. The plural chips 1 on the wafer 2 are each provided with plural pads (external terminals of each semiconductor chip), e.g., six pads.

Next, with reference to the test flow chart of FIG. 3, a description will be given below about an example of a test flow in the simultaneous testing method by whole-surface contact at wafer level according to this embodiment.

Though not specially limited, the flash memories to be tested are each provided with plural flash memory cells which are selected by address selection, a fuse for optimizing a read decision level in data read and a power supply circuit whose trimming condition is set by the fuse, and a fuse for a relief address corresponding to a defective memory cell and a corresponding relief circuit.

In the flash memory test according to this embodiment, though not specially limited, there are conducted a first test involving plural operation steps which comprise erase, post erase, write, read, and decision under a first test condition, a second test involving the same plural steps as in the first test under a second test condition different from the first test condition, a third test comprising power trimming, blowing of fuse, voltage monitor, and decision, and a fourth test comprising relief and decision.

For ease of understanding, the first test may be understood to be a test conducted under a supply voltage which corresponds to a lower limit of an operating voltage to be guaranteed, and the second test may be understood to be a test conducted under a supply voltage corresponding to an upper limit of the operating voltage. However, it is to be noted that the difference in test conditions between the first and second tests is not limited to one concerned with supply voltage, but can be set by changing the write data values or patterns in the respective write operations for example or by another change.

In the first and second tests, "erase" is an erase operation for bringing the memory cell threshold voltage in each chip into an erase level for initialization. Though not specially limited, in the case where a chip serving as a flash memory has plural memory blocks, the erase is performed so that it can be done block by block in accordance with a command for block selection. "Post erase" is a weak rewrite operation for narrowing the threshold voltage distribution at the erase level. "Write" is a write operation for writing a voltage corresponding to "0" or "1" into a selected memory cell and making the threshold voltage level into a write level corresponding to "0" or "1". For writing test data into plural addressed flash memory cells within a chip, addresses lying in a desired address range are indicated plural times from the exterior of the chip and the supply of write data for memory cells having the indicated addresses is performed. Though not specially limited, the write for test is not a combination of a single write and a single read, but is a sequential write for sequential addresses lying in the desired address range.

"Read" is a read operation for reading the voltage level written in the write operation and judging whether the voltage level has reached one corresponding to "0" or "1." Read is performed by sequential read address designation in a desired address range.

In the first and second tests, if the decision answer is negative (No), the operations beginning with the write operation are again repeated and the test is completed when it is judged that all the memory cells to be tested have reached the voltage level corresponding to "0" or "1."

In the third test, "power trimming" is an operation for trimming, while shifting, the voltage generated from the power supply circuit in each chip 1 in accordance with the test result. "Blowing of fuse" is an operation for cutting a fuse corresponding to the trimming voltage. "Voltage monitor" is an operation for monitoring whether a desired trimming voltage is generated after cutting of the fuse. In this third operation, if the decision answer is negative, the operations beginning with power trimming are repeated and the test is completed upon occurrence of the desired trimming voltage (the decision answer is affirmative; Yes).

In the fourth test, "relief" is an operation for relieving a fail bit in each chip 1 in accordance with the test result. In this relief operation, for replacing the memory cell judged to be a fail bit in each chip 1 with a memory cell for redundancy, the fuse corresponding to the fail bit is cut and the fail bit is replaced with a redundancy bit. In this fourth operation, if the decision answer is negative, the relief operation is repeated and the test is completed upon replacement of the fail bit with the redundancy bit (the decision answer is Yes).

For the test, various methods can be taken into account, including marching, checker, and galloping, in addition to write and read of all "0" and all "1." More particularly, in the case of a simple cell stack imperfection, the defect can be detected by merely writing "0" and "1" into the memory cell and reading the data. But in the case of such a defect as results from interference between memory cells or from multiple decoder selection, the detection of the defect must rely on a combination of access data between a memory cell concerned and a memory cell adjacent thereto or a combination between an address concerned and an address adjacent thereto. For improving the percent defect detection in such a case there is adopted a test method able to cope with various defect modes.

Figure 3:
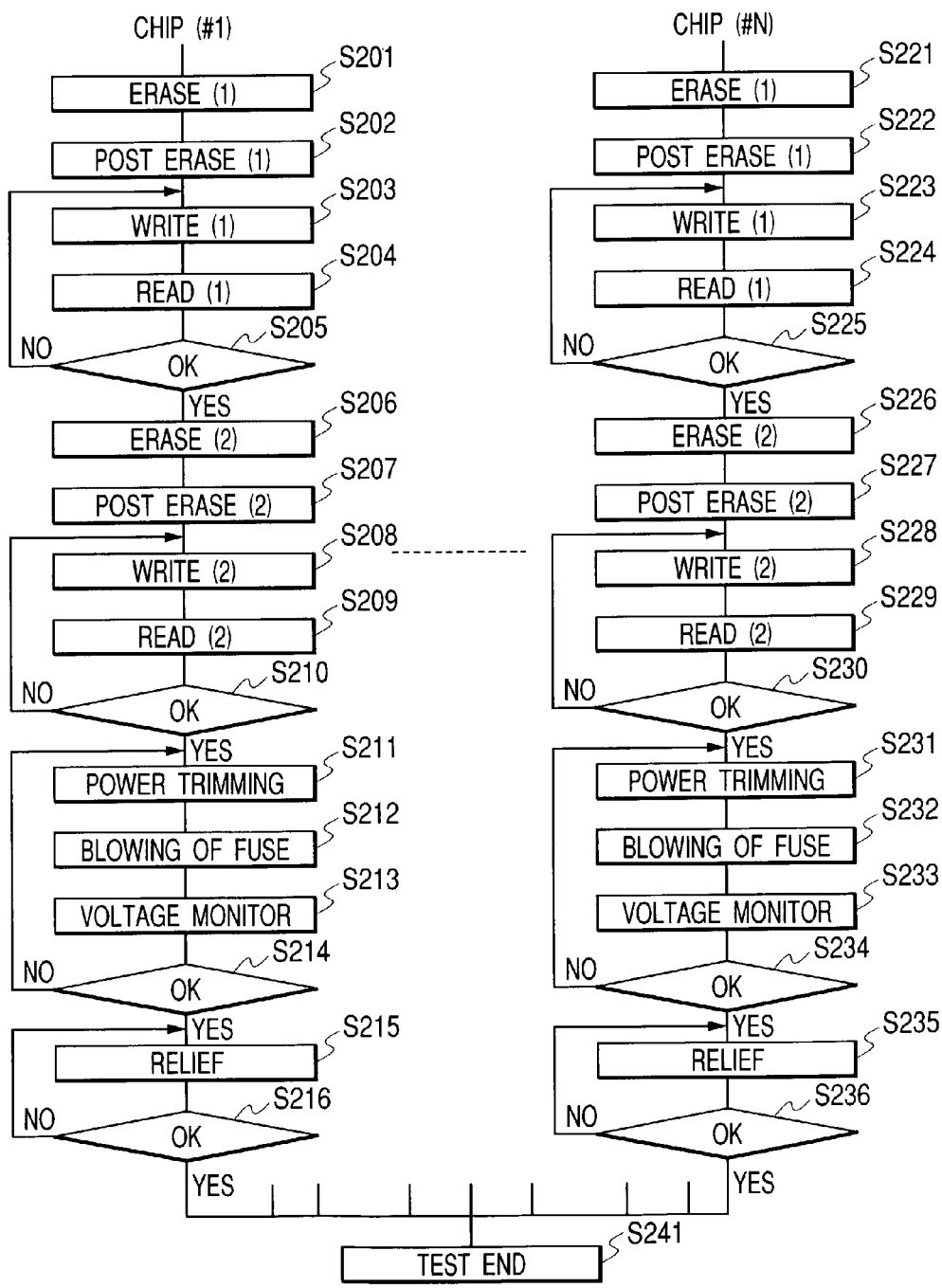
FIG. 3 is a test flow diagram showing a simultaneous test method by whole-surface contact at a wafer level in the semiconductor device manufacturing process of the first embodiment.

The test flow of FIG. 3 shows that the test is proceeded substantially independently for each of plural chips. This point will be described below in a successive manner.

(1) A first test comprising erase, post-erase, write, and read is conducted for chip 1 (#1) on wafer 2 (steps S201 to S204), followed by judgment as to whether the first test has been completed or not (S205), and upon completion of the first test, a shift is made to the execution of a second test. That is, a second test comprising erase, post-erase, write, and read is conducted (S206 to S210), and upon completion of the second test, a shift is made to a third test which comprises power trimming, blowing of fuse, voltage monitor, and decision (S211 to S214). Further, after the end of the third test, a shift is made to the execution of a fourth test which comprises relief and decision (S215 and S216). When the relief operation in the fourth test ends, the test of all test items for the chip 1 (#1) is over.

(2) Also for the other chips 1 (#2) to (#N) on the wafer 2, as is the case with the chip 1 (#1), in parallel with the chips 1(#2) to (#N), the first test comprising erase, posterase, write, read, and decision, the second test comprising erase, post-erase, write, read, and decision, the third test comprising power trimming, blowing of fuse, voltage monitor, and decision, and the fourth test comprising relief and decision, are conducted in such a manner that the end of a preceding test is followed by the execution of the next test (S221 to S236). In each of the chips 1 (#2) to (#N), the end of relief operation leads to the end of test of all the test items.

(3) When the test of all the items in chips 1 (#1) to (#N) on the wafer 2 is over, all the tests for all the chips 1 (#1) to (#N) terminate (S241). Upon completion of the test for all the chips on the wafer, the test for one wafer 2 is completed.

In the test flow according to this embodiment it is possible to effect a simultaneous test by whole-surface contact at the wafer level. This is the same as in the technique (FIG. 10) which the present inventor has studied as a premise of the present invention. But the test of each chip 1 is controlled individually by the BOST board 5 with chip-by-chip control circuits mounted thereon, so unlike the technique studied previously, when one chip 1 has gone through the test of one test item, a shift to the next test for that chip is not required to stand by until the end of test of the other chips 1.

Figure 4:
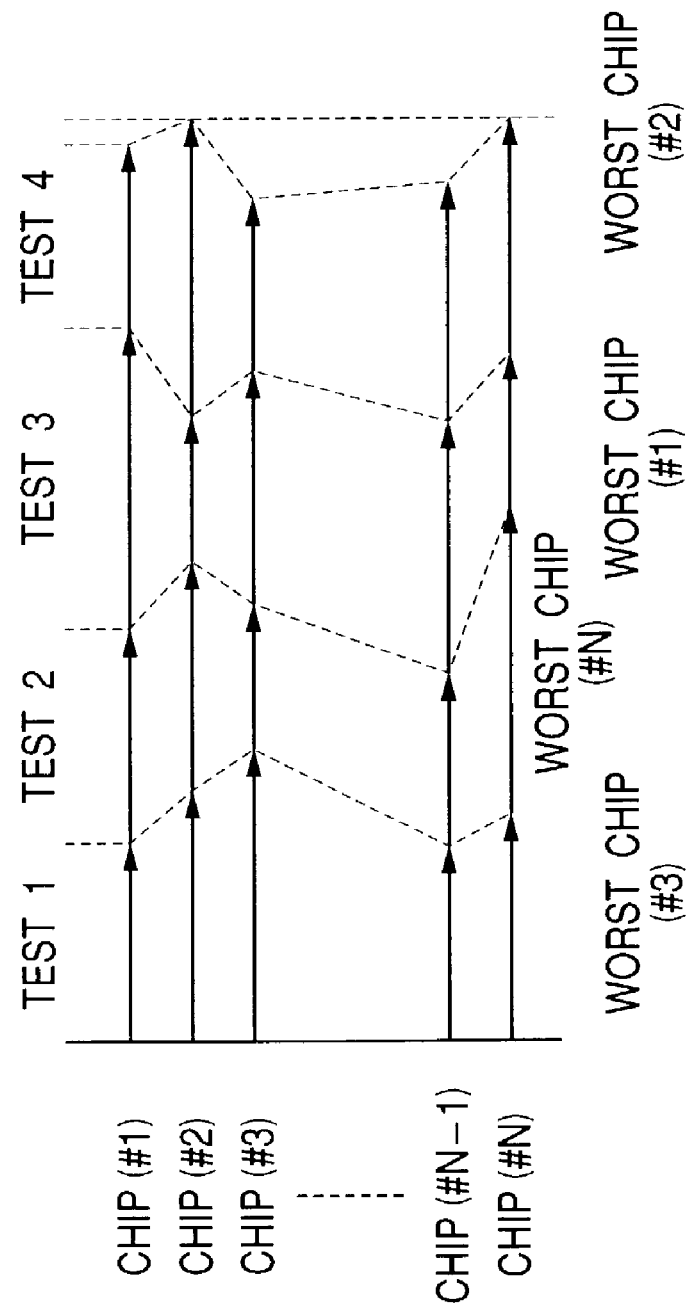
FIG. 4 is an explanatory diagram showing a test time sequence of the test flow of FIG. 3 used in the semiconductor device manufacturing process of the first embodiment.

This will be better understood by reference to an example of test time sequence shown in FIG. 4.

The example of test time sequence shown in FIG. 4 represents the execution of the test items of tests 1, 2, 3, and 4 for conducting the first to fourth tests shown in FIG. 3 with respect to the chips 1 (#1), (#2), (#3), ..., (#N−1), (#N) on the wafer 2.

For the chips (#1) to (#N) on the wafer 2, the test items are executed in the order of tests 1, 2, 3, and 4 in such a manner that the end of a preceding test item is followed by the execution of the next test item.

In the test of each test item, the test end time differs depending on each chip 1. In the illustrated sequence example, the chip 1 (#3) is the lowest in test end time in test 1, namely, it is the worst chip. Likewise, chip 1 (#N), chip 1 (#1), and chip 1 (#2) become worst chips in tests 2, 3, and 4, respectively.

In the simultaneous test method according to this embodiment, as in the sequence example of FIG. 4, all the chips 1 lying on the wafer 2 are test-started at a time, and subsequently, upon completion of a certain test of one chip, a shift is made to the next test irrespective of whether the test of the other chips has been completed or not. Thus, even if the test time differs among the chips and a worst chip differs test item by test item, since the test of each chip 1 is controlled individually by the BOST circuit, there is no stand-by time for each chip, so that the total test time becomes shorter than in the technique (FIG. 11) which the present inventor has studied as a premise of the present invention.

Figure 5:
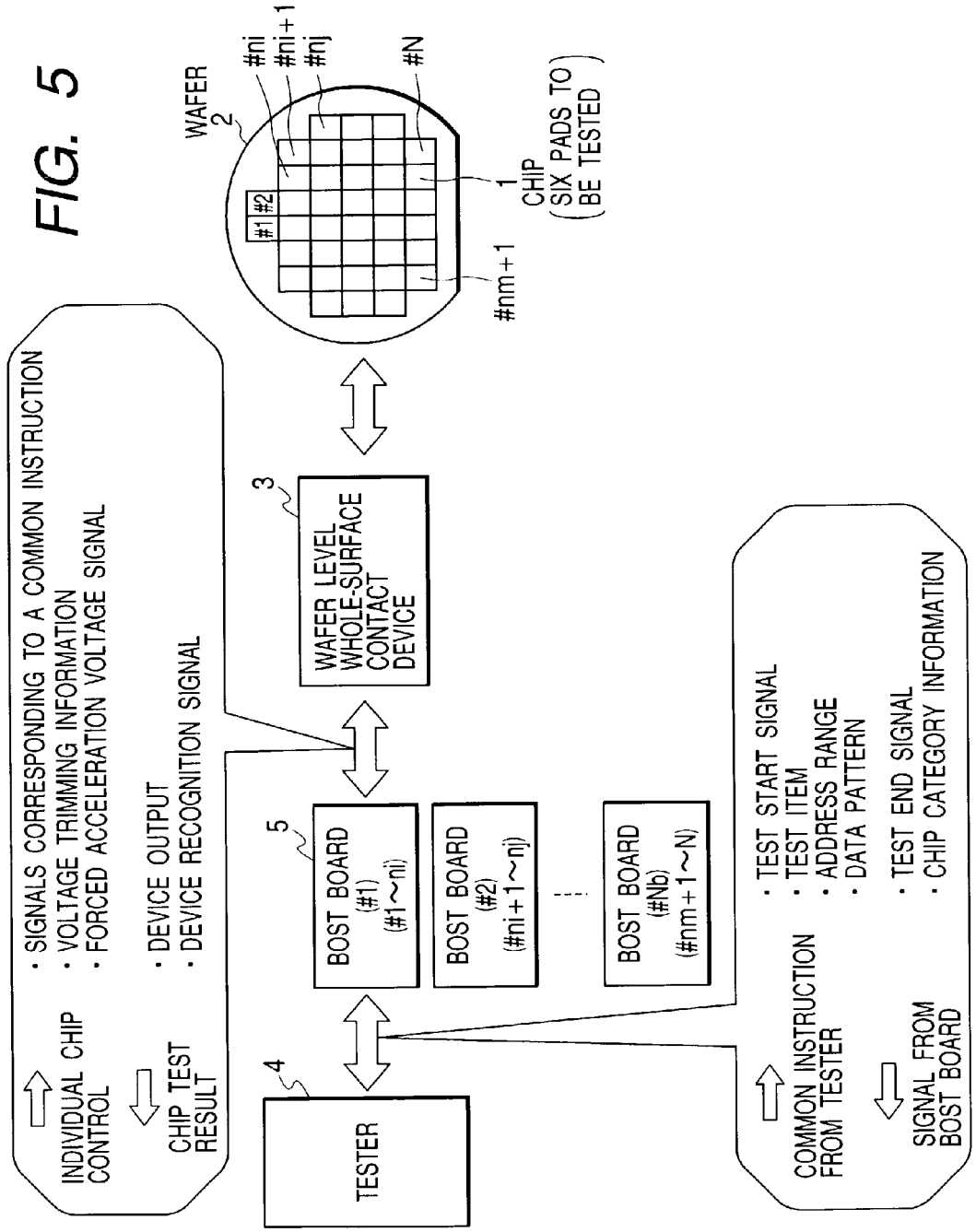
FIG. 5 is a construction diagram of the test system used in the semiconductor device manufacturing process of the first embodiment.

Next, with reference to the construction diagram of FIG. 5 which illustrates a test system, a more detailed description will be given below about the construction and operation of the test system which enables such a test sequence as shown in FIG. 4.

The illustrated test system is made up of a wafer 2, the wafer 2 having on a main surface thereof a plurality of chips 1 serving as flash memories respectively, a wafer level whole-surface contact device 3 for contact with the whole surface of the wafer 2, a tester 4 for testing electric characteristics of each chip 1, and a plurality of BOST boards 5 interposed between the tester 4 and the wafer level whole-surface contact device 3.

In this test system, for example a general-purpose memory tester is used as the tester 4 and plural BOST boards 5 are placed between the tester and the wafer level whole-surface contact device 3 to permit a simultaneous test of all of the chips 1 present on the wafer 2. Plural (Nb) BOST boards 5 are used, which make it possible to control ni pieces of chips 1 on the wafer 2. That is, N number of chips 1 on the wafer 2 are controlled by Nb number of BOST boards 5 (Nb≦N).

For example, the correspondence between Nb number of BOST boards 5 and N number of chips 1 on the wafer 2 through the wafer level whole-surface contact device 3 is established in the following manner. BOST board 5 (#1) is allocated to chips 1 (#1) to (#ni). Likewise, BOST board 5 (#2) is allocated to chips 1 (#ni+1) to (#nj), ..., and the last BOST board 5 (#Nb) is allocated to chips 1 (#nm+1) to (#N).

The tester 4 is constructed so as to provide Test Start signal, Test Item designating information, Address Range information, Data Pattern, and Clock signal as common instructions to each BOST board 5. Further, the tester 4 is constructed so as to receive such test result information as Test End signal and Chip Category information from each BOST board 5. In other words, the tester 4 does not operate as such a commonly-used tester as forms various test signals for testing chips directly by itself and tests output signals from the chips on the basis of expected value information, but it controls each BOST board for test and obtains test results on the basis of information provided from each BOST board. Therefore, the tester 4 can be regarded as constituting a host tester or a test controller.

The operation of each BOST board 5 is controlled in accordance with the foregoing control signals provided from the tester 4, and each BOST board 5 provides signals corresponding to the above common instructions, voltage trimming information, and Forced Acceleration Voltage signal, as individual chip control information to each chip 1 through the wafer level whole-surface contact device 3. Further, each BOST board 5 receives device output and Device Recognition signal from each chip 1 through the wafer level whole-surface contact device 3.

Each BOST board forms test result information by reference to signals provided from each chip and, upon completion of the testing operation, sends Test End signal and chip category information to the tester 4, whereby it becomes possible for the tester 4 to recognize the test result of each chip 1.

Figure 6:
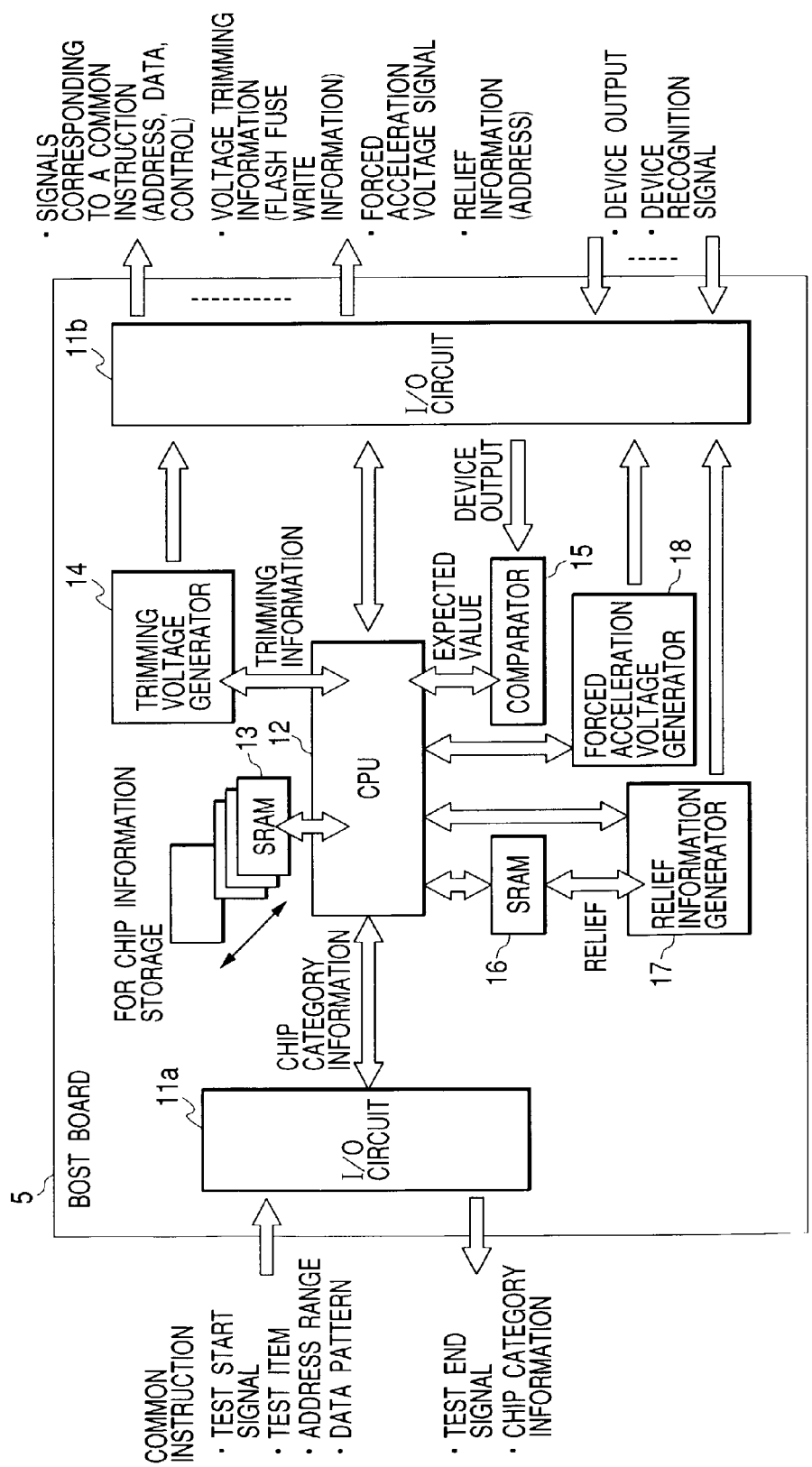
FIG. 6 is a functional block diagram showing a BOST board used in the semiconductor device manufacturing process of the first embodiment.

Next, with reference to the functional block diagram of FIG. 6, a description will be given below about an example of BOST board which makes a simultaneous independent test of plural chips possible by such test operation control from the tester 4 as described above.

As shown in the same figure, each BOST board 5 is made up of a first input/output circuit (I/O circuit) 11a disposed between the BOST board and the tester 4, a second I/O circuit 11b disposed between the BOST board 5 and the wafer level whole-surface contact device 3, a CPU 12 which controls, for example, the execution of test in each chip 1 on the wafer 2, a SRAM 13 which stores test information, trimming information, and relief information of each chip 1, a trimming voltage generator 14 for trimming the power supply circuit in each chip 1, a comparator 15 for comparing the test results of chips 1 and making a decision, a SRAM 16 and a relief information generator 17 for generating relief data to relieve a fail bit in each chip 1, and a forced acceleration generator 18 for accelerating a specific test forcibly.

The first and second I/O circuits 11a, 11b are interface circuits for interface between the tester 4, as well as the wafer level whole-surface contact device 3, and an internal circuit formed within the BOST board 5. In the exterior of the BOST board 5 the first and second I/O circuits 11a, 11b are connected to the tester 4 and the wafer level whole-surface contact device 3, while in the interior of the BOST board 5 they are connected to the CPU 12, trimming voltage generator 14, comparator 15, relief information generator 17, and forced acceleration voltage generator 18.

The first I/O circuit 11a receives Test Start signal, Test Item Control signal (e.g., Erase, Write, Read), test address range information, and data pattern (e.g., all "0," all "1") as common instructions from the tester 4, and provides signals (Address, Data, Control) corresponding to the common instructions, voltage trimming information (flash fuse write information), Forced Acceleration Voltage signal, and relief information (address) to each chip 1. Further, the first I/O circuit 11a provides Test End signal and chip category information (e.g., good/bad, mat/block defect) to the tester 4.

The second I/O circuit 11b receives device output and Device Recognition signal from each chip 1 and sends them to the CPU 12 and the comparator 15.

As shown in the figure, the CPU 12 is connected to the first and second I/O circuits 11a, 11b, SRAM 13, trimming voltage generator 14, comparator 15, SRAM 16, relief information generator 17, and forced acceleration voltage generator 18, and it is an information processing circuit which determines the state the test of each chip 1 on the wafer 2 and which instructs the execution of a test.

The CPU 12 receives a Test Start signal, a Test Item Control signal, test address range information and a data pattern from the first I/O circuit 11a, then provides signals corresponding to the foregoing common instructions, voltage trimming information, a Forced Acceleration Voltage signal, and relief information to each chip 1 through the second I/O circuit 11b, and executes a test for each chip 1. Moreover, the CPU 12 sends out trimming information to the trimming voltage generator 14, provides a trimming voltage to each chip 1 through the second I/O circuit 11b, and provides control so that there is performed a power trimming operation of each chip 1.

Further, as to a device output based on a Device Recognition signal of test results provided from each chip 1 through the second I/O circuit 11b, the CPU 12 compares it with an expected value in the comparator 15 and makes a pass/fail bit decision. As to a fail bit, the CPU 12 causes this information to be stored in SRAM 16, then sends associated relief information to the relief information generator 17, provides relief information to each chip 1 through the second I/O circuit 11b, and provides makes control so that a fail bit relief operation is performed. As to a specific test, the CPU 12 provides control so that an acceleration voltage is fed to each chip 1 through the forced acceleration voltage generator 18. Then, the CPU 12 sends a Test End signal and chip category information to the tester 4 through the first I/O circuit 11a.

The SRAM 13 is a memory circuit for the storage of test results of each chip 1 on the wafer 2 and for the storage of a trimming voltage and a fail bit address. It is connected to the CPU 12. In the SRAM 13, information on each chip 1 is stored as necessary on the basis of the execution of a test which is controlled by the CPU 12.

The trimming voltage generator 14 is a voltage generator which trims the power supply circuit in each chip 1 on the wafer 2, and it is connected to I/O circuit 11b and CPU 12. The trimming voltage generator 14 generates a trimming voltage on the basis of the execution of a test controlled by the CPU 12 and in accordance with trimming information.

The comparator 15 compares test results of chips 1 on the wafer 2 and makes a decision. It is connected to both I/O circuit 11b and CPU 12. In the comparator 15, a device output of a test result provided from each chip 1 through the I/O circuit 11b is compared with an expected value on the basis of the execution of the test controlled by the CPU 12 and a pass/fail bit decision is made.

The SRAM 16 and the relief information generator 17 are relief circuits for the relief of a fail bit in each chip 1 on the wafer 2. The SRAM 16 is connected to both CPU 12 and relief information generator 17, while the relief information generator 17 is connected to the CPU 12, SRAM 16, and I/O circuit 11b. The SRAM 16 stores relief information based on a fail bit. The relief information generator 17 provides relief information to each chip 1 through the I/O circuit 11b on the basis of the relief information stored in SRAM 16 to perform a relief processing for the fail bit.

The forced acceleration voltage generator 18 is a circuit for accelerating a specific test forcibly and it is connected to both CPU 12 and I/O circuit 11b. On the basis of the execution of a test controlled by CPU 12 the forced acceleration voltage generator 18 generates an acceleration voltage for a specific test and provides it to each chip 1 through the I/O circuit 11b.

In each BOST board 5, as is apparent from the above, its second I/O circuit is required to have I/O terminals of such a number as corresponds to terminals of each of the chips to be tested simultaneously. According to a rather general semiconductor device manufacturing technique matching the recent tendency to a larger wafer diameter and simultaneous acquisition of many chips, the number of terminals required to be electrically contacted at the time of test by plural semiconductor chips which are formed on a single semiconductor wafer is often about ten thousand or more. The construction using plural BOST boards 5 is an appropriate construction in avoiding an increase in the number of terminals of the I/O circuit 11b in each board and restricting the number of chips to be controlled by one CPU to facilitate the simultaneous independent test for plural chips. In other words, such a construction facilitates the formation of BOST boards.

Figure 7:
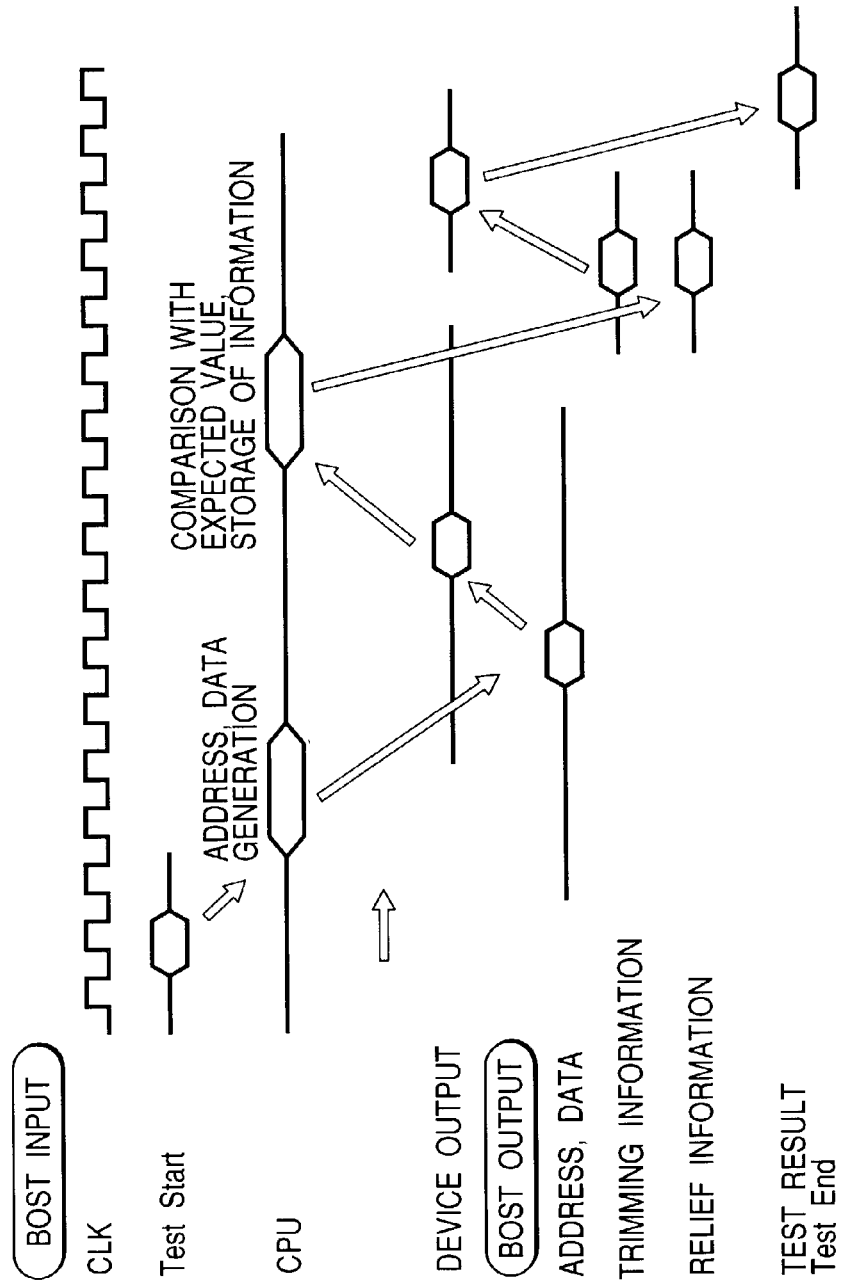
FIG. 7 is a timing chart showing an operation sequence of the BOST board of FIG. 6 in the semiconductor device manufacturing process of the first embodiment.

Next, an example of operation sequence of the BOST board shown in the above FIG. 6 will be described below with reference to the operation sequence timing chart of FIG. 7.

The BOST board 5 receives, as input signals from the tester 4, a clock signal, CLK, and a test start signal, Test Start, which is synchronized with the clock signal CLK. Upon receipt of the Test Start signal the BOST board 5 generates Address, Data, and Control signals under the control of CPU 12 and outputs these signals to each chip 1.

The BOST board 5 receives, as input from each chip 1, a device output of test result provided in response to Address, Data, and Control signals, then compares the device output with an expected value under the control of CPU 12 and makes a decision, then stores the result of the comparison and decision in SRAM 13. The information stored in the SRAM 13 is used as trimming information by the trimming voltage generator 14 and as relief information by the relief information generator 17.

Where required after trimming and relief, the BOST board 5 again outputs Address, Data, and Control signals to each chip 1 and receives a device output of test result from each chip, then if it is judged by the CPU 12 that the test is over, the BOST board 5 outputs the test result and a test end signal, Test End, to the tester 4.

Figure 8:
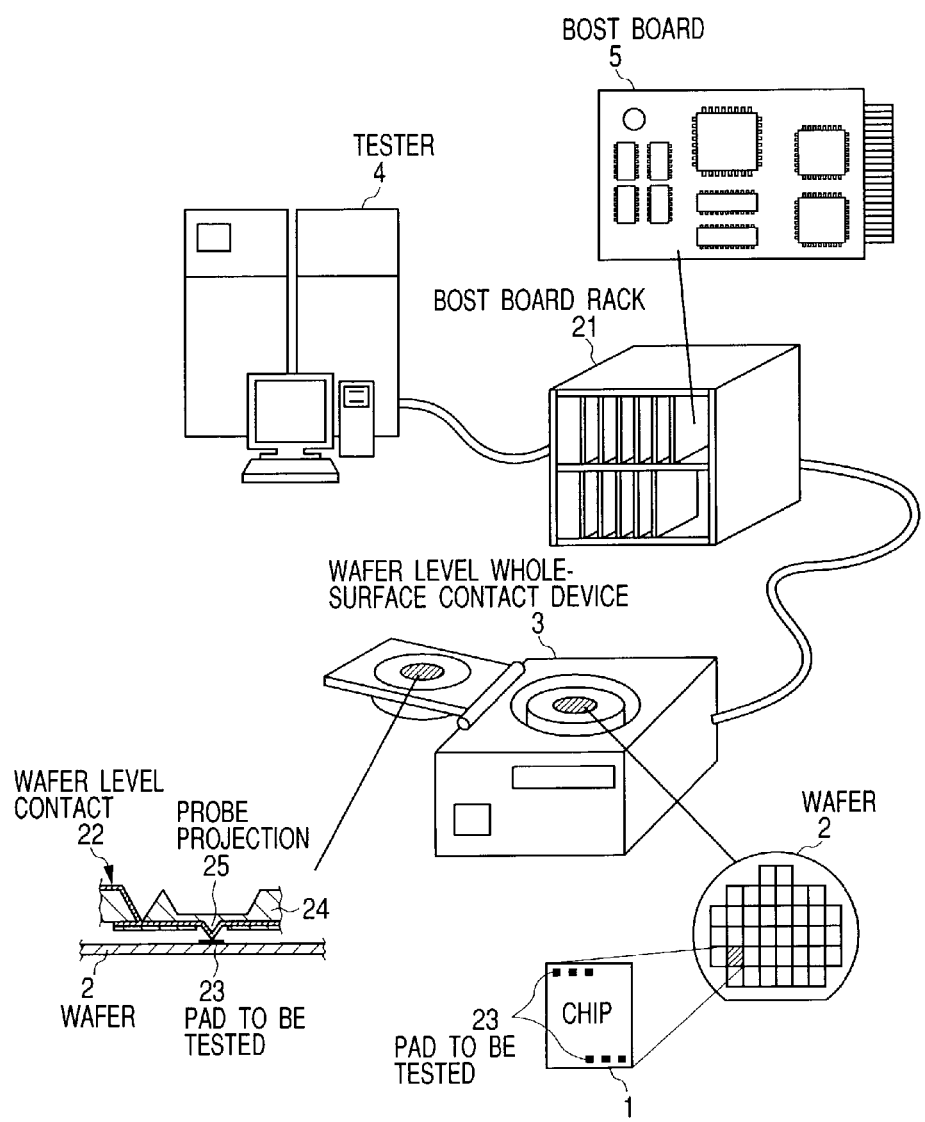
FIG. 8 is a schematic diagram showing a hardware configuration of the test system used in the semiconductor device manufacturing process of the first embodiment.

Next, an example of a hardware configuration of the test system will be described below with reference to FIG. 8 which schematically illustrates the example.

The test system is hardwarewise composed of a wafer level whole-surface contact device 3 for contact with the whole surface of the wafer 2 which comprises plural chips 1 with flash memory circuits formed thereon, a tester 4 constituted by a general-purpose memory tester for testing electric characteristics of each chip 1 on the wafer 2, and a BOST board rack 21 incorporating plural BOST boards 5 which are connected between the tester 4 and the wafer level whole-surface contact device 3.

Though not specially limited, the BOST board 5 is constituted as follows. The functions of I/O circuits 11a, 11b, CPU 12, SRAM 13, trimming voltage generator 14, comparator 15, SPAM 16, relief information generator 17, and forced acceleration voltage generator 18, which have been explained above in connection with FIG. 6, are implemented by ASIC such as FPGA and SRAM and these components are mounted on a substrate having board rack mounting terminals. The BOST board rack 21 is constituted so that it can receive therein plural BOST boards capable of being inserted and set. The tester 4 and the BOST board rack 21 are electrically connected with each other through such a cable as shown in the figure.

Likewise, the BOST board rack 21 and the wafer level whole-surface contact device 3 are connected together through a cable. Although in FIG. 8 there is illustrated a method wherein the wafer level whole-surface contact device 3 uses a single wafer level contactor 22 to effect contact of all the chips 1 on one wafer 2, a method of testing plural wafers 2 at a time is also applicable to the case where wafers 2 are packed one by one.

The wafer 2 to be tested is formed with plural chips 1. Each chip 1 is constructed so as to have six pads (external terminals) 23 for I/O, control, and power supply. An electric connection to each chip 1 is effected by the wafer level contactor 22 which is incorporated in the wafer level whole-surface contact device 3. The wafer level contactor 22 is required to have a very large number of contactors so as to correspond to the pads of all the chips on the wafer 2 to be tested and is hence required to have such a fine size as can correspond to the pads of each chip. For example, like the wafer to be tested, there may be used a silicon substrate 24 and such probe projections 25 as come into contact with the to-be-tested pads 23 of each chip 1 on the silicon wafer 24 may be formed by a process similar to the wafer process. But another material may be used in fabricating the contactor. In the illustrated example, the contactor 22 is provided on one main surface thereof with probe projections 25, i.e., contactors, which are formed of a metallic material. A metallic wiring layer extended to one main surface of the contactor is connected to the probe projections 25, while to the metallic wiring layer are connected oblique holes formed through main surfaces of the substrate 24 and is also connected a metallic wiring layer extended to an opposite main surface of the substrate. An electric connection of the BOST board to the probe projections 25 is made by wiring connection to the metallic wiring layer formed on the opposite main surface of the substrate 24. On the opposite main surface side of the substrate 24 the portions opposed to the probe projections 25 are removed, whereby a certain flexibility is imparted to the substrate portions which support the probe projections, thereby ensuring a satisfactory contact irrespective of slight variations (change of distance) in the distance between the wafer surface to be tested and the contactor 22 which variations result from various factors.

The wafer level whole-surface contact device 3 is provided on its body side with a test stage having a high flatness and the illustrated wafer 2 to be tested is placed on the test stage. The contactor 22 is supported by a support member which is mounted on the device body side to that it can be opened and closed.

In carrying out the test, the wafer 2 is put on the body-side test stage and the contactor 22 is brought into contact with pads on the wafer by rotation of the support member. A load for attaining a satisfactory contact between the contactor 22 and the pads on the wafer 2 is provided by the support member or by a loading means (not shown).

It goes without saying that the test is conducted in an environment in which the temperature and humidity of the entire surroundings of the wafer level whole-surface contact device are controlled.

Therefore, according to the semiconductor device manufacturing process of this embodiment, in the chips 1 as flash memories of different test times in the wafer 2, each test item is controlled chip by chip by the BOST board 5 inserted between the wafer 2 and the tester 4 and with a control circuit mounted thereon, so that the total test time for a single wafer 2 can be minimized. The resulting shortening of the test time permits reduction of the test cost and improvement of the throughput.

(Second Embodiment)

A semiconductor device manufacturing process according to a second embodiment of the present invention will be described below in detail with reference to FIG. 9 which illustrates the process.

Like the above first embodiment, the semiconductor device manufacturing process of this second embodiment also uses a wafer level whole-surface contact device for contact with the whole surface of a wafer, but, unlike the first embodiment, adopts a construction suitable for avoiding the simultaneous test of all the chips on wafer whenever necessary. A case where it is better to avoid the simultaneous test of all the chips on wafer occurs, for example, when the number of signal lines in each of plural chips is large and so, with a limited number of BOST boards, it is difficult to carry out the concurrent test of all the chips on wafer.

Figure 9:
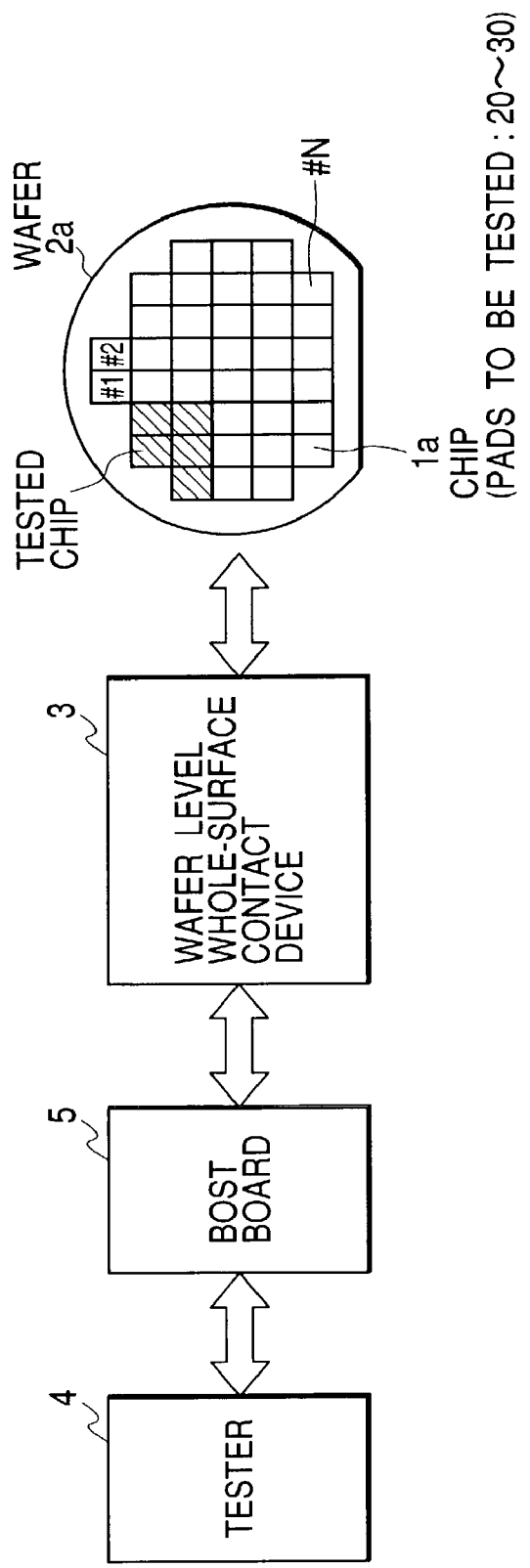
FIG. 9 is a conceptual diagram showing a basic construction of a test system used in a semiconductor device manufacturing process according to a second embodiment of the present invention.

The test system illustrated in FIG. 9 comprises a wafer 2a with plural chips 1a formed thereon which chips constitute flash memories, a wafer level whole-surface contact device 3 for contact with the whole surface of the wafer 2a, a tester 4 for testing electric characteristics of each chip 1a on the wafer 2a, and a BOST board 5 as BOST means interposed between the tester 4 and the wafer level whole-surface contact device 3 and constituted by a substrate with chip-by-chip control circuits mounted thereon.

In this second embodiment, the chips 1a on the wafer 2a to be tested are each provided with a relatively large number of pads, for example, 20 to 30 pads.

The test system of this embodiment is constructed so as to be applicable also to the case where even if all signals are sent to the tester 4, it is impossible to handle all of them, for example due to a large number of signal lines per chip 1a on the wafer 2a. More specifically, there is adopted a method wherein the concurrent test as in the first embodiment is performed for a set of plural chips 1a out of all the chips 1a on the wafer 2, and after this set of chips 1a have been tested for test items, test signals are fed to the other untested chips 1a than the above set of chips, allowing the test to be carried out chip by chip.

Thus, out of N pieces of chips 1a on the wafer 2a, plural chips are tested simultaneously within the range matching the capacity of the tester 4. The BOST board 5 detects information of a chip 1a the test of which has been completed earlier, and sends it to the tester 4, which in turn starts testing another chip 1a immediately in accordance with the signal. In this way there is obtained an effect close to the test time sequence effect shown in FIG. 4 in the first embodiment.

Thus, according to the semiconductor device manufacturing process of this embodiment, even in the case where the number of test signals per chip 1a on the wafer 2a is large and even if all signals are sent to the tester 4, it is impossible to handle all of them, a set of plural chips 1a having already been tested are substituted by untested chips 1a in the course of test for test items, whereby the total test time for a single wafer 2a can be minimized as in the first embodiment and hence it is possible to attain the reduction of test cost and improvement of the throughput.

Although the present invention has been described above concretely by way of embodiments thereof, it goes without saying that the invention is not limited to the above embodiments, but that various changes may be made within the scope not departing from the gist of the invention.

For example, although a flash memory was referred to as an example in the above embodiments, the process of the present invention is also applicable effectively to a nonvolatile memory such as EEPROM, a flash memory card, and a flash memory module, and further to a microcomputer which incorporates a flash memory.

The following is a brief description of effects obtained by typical inventions disclosed herein.

(1) In a semiconductor device with different test times of chips on wafer, each test item is controlled chip by chip by BOST means interposed between the wafer and the tester, whereby it becomes possible to minimize the total test time for a single wafer.

(2) As a result of shortening of the test time per wafer mentioned in the above (1) it becomes possible to reduce the test cost of the semiconductor device and improve the throughput.

What is claimed is:

1. A process for manufacturing a semiconductor device, comprising the steps of:
    making a simultaneous electric contact with a plurality of chips on a wafer; and
    testing electric characteristics of the plurality of chips in a parallel manner,
    wherein the step of testing electric characteristics comprises sending a test control signal from a test controller to a test circuit interposed between the test controller and the wafer and allowing the plurality of chips, out of a set of chips on the wafer, to undergo an independent test simultaneously by a test circuit which is controlled with the test control signal, and
    wherein when the test of the chips to be tested is over, the test of untested chips is conducted by the test circuit.

2. A process for manufacturing a semiconductor device, comprising the steps of:
    making a simultaneous electric contact with a plurality of chips on a wafer; and
    testing electric characteristics of the plurality of chips in a parallel manner,
    wherein the step of testing electric characteristics comprises sending a test control signal from a test controller to a test circuit interposed between the test controller and the wafer and allowing an independent test to be conducted chip by chip simultaneously for each of the chips on the wafer by the test circuit which is controlled with the test control signal, and
    wherein after the start of the simultaneous test for each of the chips on the wafer and after a first test, a first chip of the plurality of chips is subjected to a second test different from the first test without waiting for the end of the first test of a second chip of the plurality of chips.

3. The process according to claim 2, wherein subsequent to the step of testing electric characteristics, the process further comprising the steps of: grinding a surface of the wafer to reduce the thickness of the wafer; dividing the wafer into individual chips; and obtaining chips which have passed the test of electric characteristics as products.

4. A process for manufacturing a semiconductor device, comprising the steps of:
    making a simultaneous electric contact with a plurality of chips on a wafer; and
    testing electric characteristics of the plurality of chips in a parallel manner,
    wherein the step of testing electric characteristics comprises sending a test control signal from a test controller to a test circuit interposed between the test controller and the wafer and allowing an independent test to be conducted chip by chip simultaneously for each of the chips on the wafer by the test circuit which is controlled with the test control signal, and
    wherein the test circuit includes: an interface circuit interposed between the test controller and a contact device for electric contact with the chips on the wafer; a CPU for managing the state of progress of a test for each chip on the wafer and for instructing the execution of a test a memory circuit for storing test result data, trimming data, and a fail bit address with respect to each of the chips; a voltage generating circuit for trimming the circuit of each of the chips; a relief circuit for relieving a fail bit of each of the chips; and an acceleration voltage generating circuit for forcibly accelerating a change in electric characteristics of each of the chips.

5. A process for manufacturing a semiconductor device, comprising the steps of:
    making a simultaneous electric contact with a plurality of chips on a wafer; and
    testing electric characteristics of the plurality of chips in a parallel manner,
    wherein the step of testing electric characteristics comprises sending a test control signal from a test controller to a test circuit interposed between the test controller and the wafer and allowing the plurality of chips, out of a set of chips on the wafer, to undergo an independent test simultaneously by a test circuit which is controlled with the test control signal, and
    wherein after the start of the simultaneous test for the plurality of chips out of the set of the chips on the wafer and after a first test, a first chip of the plurality of chips is subjected to a second test different from the first test without waiting for the end of the first test of a second chip of the plurality of chips.

6. The process according to claim 5, wherein subsequent to the step of testing electric characteristics, the process further comprising the steps of: grinding a surface of the wafer to reduce the thickness of the wafer; dividing the wafer into individual chips; and obtaining chips which have passed the test of electric characteristics as products.

7. A process for manufacturing a semiconductor device, comprising the steps of:
    making a simultaneous electric contact with a plurality of chips on a wafer; and
    testing electric characteristics of the plurality of chips in a parallel manner,
    wherein the step of testing electric characteristics comprises sending a test control signal from a test controller to a test circuit interposed between the test controller and the wafer and allowing the plurality of chips, out of a set of chips on the wafer, to undergo an independent test simultaneously by a test circuit which is controlled with the test control signal, and wherein the test circuit includes: an interface circuit interposed between the test controller and a contact device for electric contact with the chips on the wafer; a CPU for managing the state of progress of a test for each chip undergoing a test on the wafer and for instructing the execution of a test; a memory circuit for storing test result data, trimming data and a fail bit address with respect to each of the chips undergoing a test; a voltage generating circuit for trimming the circuit of each of the chips undergoing a test; a relief circuit for relieving a fail bit of each of the chips undergoing a test; and an acceleration voltage generating circuit for forcibly accelerating a change in electric characteristics of each of the chips undergoing a test.

* * * * *